(12) United States Patent
Chang

(10) Patent No.: US 11,159,146 B2
(45) Date of Patent: Oct. 26, 2021

(54) RECONFIGURABLE ANALOG FILTER AND INTEGRATED CIRCUIT INCLUDING THE SAME

(71) Applicant: SAMSUNG ELECTRONICS CO., LTD., Suwon-si (KR)

(72) Inventor: Jisoo Chang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/876,209

(22) Filed: May 18, 2020

(65) Prior Publication Data

US 2021/0105007 A1  Apr. 8, 2021

(30) Foreign Application Priority Data

Oct. 7, 2019  (KR) .................. 10-2019-0123962

(51) Int. Cl.
*H03H 11/04* (2006.01)
*H03H 11/12* (2006.01)

(52) U.S. Cl.
CPC ......... *H03H 11/0466* (2013.01); *H03H 11/12* (2013.01)

(58) Field of Classification Search
CPC ............................ H03H 11/0466; H03H 11/12
See application file for complete search history.

(56) References Cited

U.S. PATENT DOCUMENTS

| | | | |
|---|---|---|---|
| 6,388,520 B2 | 5/2002 | Wada et al. | |
| 7,148,458 B2 | 12/2006 | Schell et al. | |
| 7,518,447 B1 | 4/2009 | Tan et al. | |
| 7,902,917 B2 * | 3/2011 | Mirzaei | H03H 7/12 327/558 |
| 8,452,253 B2 | 5/2013 | Mikhemar et al. | |
| 9,124,246 B2 * | 9/2015 | Chang | H03F 1/0277 |
| 9,608,591 B2 * | 3/2017 | Manssen | H03H 5/12 |
| 9,948,279 B1 * | 4/2018 | Chen | H03H 7/38 |
| 9,966,949 B2 | 5/2018 | Reitsma | |
| 10,153,934 B1 * | 12/2018 | Gathman | H04L 27/2688 |
| 10,439,593 B2 * | 10/2019 | Gathman | H04B 5/0012 |
| 2015/0180582 A1 | 6/2015 | Zhou et al. | |
| 2018/0091231 A1 | 3/2018 | Rodriguez-Perez et al. | |
| 2019/0280652 A1 | 9/2019 | Schober et al. | |

FOREIGN PATENT DOCUMENTS

| | | |
|---|---|---|
| KR | 10-2015-0042512 | 4/2015 |
| KR | 10-1869887 | 6/2018 |
| KR | 10-2018-0078542 | 7/2018 |
| KR | 10-2019-0077588 | 7/2019 |

* cited by examiner

*Primary Examiner* — Dinh T Le

(74) *Attorney, Agent, or Firm* — F. Chau & Associates, LLC

(57) ABSTRACT

A reconfigurable analog filter includes a transimpedance amplifier configured to convert a current signal into a voltage signal, an input capacitor configured to form a current-mode low pass filter together with an input impedance of the transimpedance amplifier, a variable load circuit including at least one switch configured to selectively close a circuit path to provide a resistor and/or a capacitor as a load of the transimpedance amplifier according to a control signal, and a low pass filter configured to filter the voltage signal.

20 Claims, 11 Drawing Sheets

US 11,159,146 B2

RECONFIGURABLE ANALOG FILTER AND INTEGRATED CIRCUIT INCLUDING THE SAME

CROSS-REFERENCE TO RELATED APPLICATION

This application claims the benefit of Korean Patent Application No. 10-2019-0123962, filed on Oct. 7, 2019, in the Korean Intellectual Property Office, the disclosure of which is incorporated herein by reference in its entirety.

TECHNICAL FIELD

This disclosure relates generally to analog filters, and more particularly, to a reconfigurable analog filter and an integrated circuit including the same.

DISCUSSION OF THE RELATED ART

Analog filters may be used as low pass, bandpass or high pass filters in various applications, and in some cases a reconfigurable analog filter with an adjustable passband/cutoff frequency is required. (Herein, a "passband" of a low pass or high pass filter are the frequencies below, or above, the cutoff frequency, respectively.) For example, in wireless communications, to support connections with respect to different radio access technology (RAT) systems each defining a different channel bandwidth, a receiver may include an analog filter having a passband that varies according to the channel bandwidth. The performance of the receiver may be dependent on the removal by the analog filter of an unwanted signal from an adjacent channel. Since the different RAT systems may have disparate operating frequency bands, an analog filter may be required to have a wide adjustable range of achievable passbands. Further if a passband is narrow, the analog filter may need to exhibit good filtering characteristics, e.g., a sharp roll-off characteristic, to minimize noise from an adjacent channel.

SUMMARY

Embodiments of the inventive concept provide a reconfigurable analog filter having a wide adjustable range of a passband and providing desirable filtering characteristics, and an integrated circuit including the reconfigurable analog filter.

According to an aspect of the inventive concept, there is provided a reconfigurable analog filter including a transimpedance amplifier configured to convert a current signal into a voltage signal, an input capacitor configured to form a current-mode low pass filter together with an input impedance of the transimpedance amplifier, a variable load circuit including at least one switch configured to selectively close a circuit path to provide a resistor and/or a capacitor as a load of the transimpedance amplifier according to a control signal, and a low pass filter configured to filter the voltage signal.

According to another aspect of the inventive concept, there is provided a reconfigurable analog filter including a transimpedance amplifier configured to convert a current signal into a voltage signal, an input capacitor configured to form a current-mode low pass filter together with an input impedance of the transimpedance amplifier, a variable load circuit configured to provide a high impedance as a load of the transimpedance amplifier in a wideband mode and provide a low impedance as a load of the transimpedance amplifier in a narrowband mode, according to a control signal, and a low pass filter configured to filter the voltage signal.

According to still another aspect of the inventive concept, there is provided an integrated circuit including a mixer configured to generate a current signal by performing down-conversion on an input signal according to a local oscillator signal, and a reconfigurable analog filter configured to provide a variable cutoff frequency according to a control signal and filter the current signal, wherein the reconfigurable analog filter includes a transimpedance amplifier configured to convert the current signal into a voltage signal, an input capacitor configured to form a current-mode low pass filter together with an input impedance of the transimpedance amplifier, a variable load circuit configured to adjust a load impedance of the transimpedance amplifier according to the control signal, and a low pass filter configured to filter the voltage signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
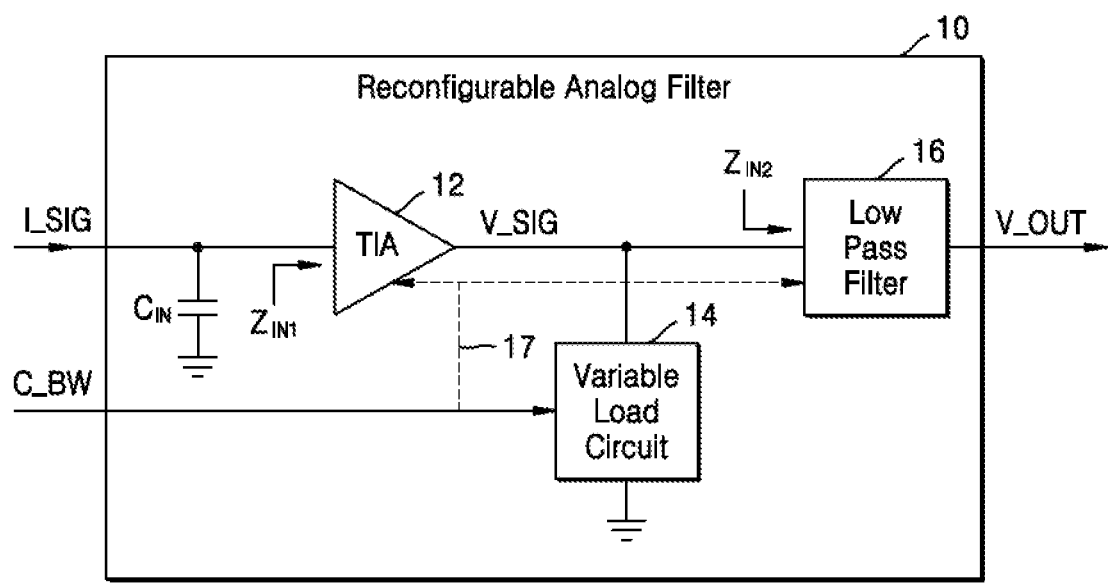
FIG. 1 is a block diagram of a reconfigurable analog filter according to an example embodiment of the inventive concept.

FIG. 1 is a block diagram of a reconfigurable analog filter 10 according to an example embodiment of the inventive concept. As illustrated in FIG. 1, the reconfigurable analog filter 10 (hereafter, just "filter 10") may generate an output voltage V_OUT by filtering a current signal I_SIG and may receive a bandwidth control signal C_BW to control an adjustable passband of the filter 10. The filter 10 may be manufactured by using a semiconductor process and may be realized as a single die, a single semiconductor package including two or more dies, or two or more semiconductor packages.

The filter 10 may filter the current signal I_SIG by attenuating signals outside a targeted passband which may be dynamically set according to the bandwidth control signal C_BW. For example, the filter 10 may be a low pass filter (LPF) having a cutoff frequency that varies according to the bandwidth control signal C_BW. (As mentioned above, a passband of a low pass filter (LPF) contains the frequencies below the cutoff frequency. Since the passband of an LPF begins at 0 Hz, the passband of an LPF may be defined as having a value equal to the cutoff frequency.) In other words, a width of the filter 10's passband may vary according to the bandwidth control signal C_BW. Herein, both the cutoff frequency and a width of a filter's passband may be simply referred to as a bandwidth. Also, a wideband mode may refer to an example herein in which the filter 10 provides a high cutoff frequency according to the bandwidth control signal C_BW. Conversely, a narrowband mode may refer to an example herein in which the filter 10 provides a relatively low cutoff frequency according to the bandwidth control signal C_BW. As illustrated in FIG. 1, the filter 10 may include an input capacitor $C_{IN}$, a transimpedance amplifier (TIA) 12, a variable load circuit 14, and a low pass filter 16.

The input capacitor $C_{IN}$ may be coupled to an input terminal of the TIA 12. Also, the input capacitor $C_{IN}$ and an input impedance $Z_{IN1}$ (which may be hereinafter referred to as a first input impedance or just "$Z_{IN1}$") of the TIA 12 may form a current-mode low pass filter. A cutoff frequency (i.e., a bandwidth as defined earlier) of the current-mode low pass filter may be determined by a capacitance of the input capacitor $C_{IN}$ and $Z_{IN1}$. The input capacitor $C_{IN}$ may have a fixed capacitance. However, as described below with reference to FIG. 2, $Z_{IN1}$ may be variable. Thus, the cutoff frequency of the current-mode low pass filter may be variable. The current-mode low pass filter may be used to at least partially remove a signal having a high amplitude in an adjacent channel. Such an adjacent channel signal may herein be referred to as a blocking signal or an interference signal.

The TIA 12 converts current into voltage, and as illustrated in FIG. 1, may convert the current signal I_SIG into the voltage signal V_SIG. As described above, the current signal I_SIG may be filtered by the current-mode low pass filter, and thus, the TIA 12 may convert the filtered current signal I_SIG into the voltage signal V_SIG. For the filter 10 to support a wide bandwidth (e.g., hundreds of MHz), the TIA 12 may also have a wide bandwidth and may include an amplifier having a high gain-bandwidth product (GBW). (GBW is the product of the amplifier's bandwidth and its gain at the frequency at which the gain is measured.) In some embodiments, the TIA 12 may receive the bandwidth control signal C_BW (hereafter, just "signal C_BW" or "control signal" for brevity) as indicated by the dotted path 17 to control its characteristics, whereas in other embodiments the TIA 12 does not receive signal C_BW.

The variable load circuit 14 may be coupled to the TIA 12 and the low pass filter 16 and may receive signal C_BW. The variable load circuit 14 may adjust a load impedance of the TIA 12 according to signal C_BW. For example, the variable load circuit 14 may include a resistor and/or a capacitor and may include a switch configured to selectively close at least one circuit path to provide, according to signal C_BW, the resistor and/or the capacitor as a load of the TIA 12. A load impedance of the TIA 12 may be determined by an impedance of the variable load circuit 14 and an input impedance $Z_{IN2}$ of the low pass filter 16 summed in parallel. (Note that a "total load" of TIA 12 may be considered the load impedance of the TIA 12. However, herein the term "load" may be used loosely to just refer to the impedance of the variable load circuit 14.) Also, the variable load circuit 14 may have a high impedance in a wideband mode and a low impedance in a narrowband mode, according to signal C_BW. For both the narrowband and wideband modes, the impedance of the variable load circuit 14 may be controlled to prevent an undesirable change in the cutoff frequency of the current-mode low pass filter, by preventing an adverse change in $Z_{IN1}$ due to a change in $Z_{IN2}$ and/or the inherent characteristics of the TIA 12 as a function of frequency. For example, the control of the variable load circuit 14's impedance in the narrowband may prevent the cutoff frequency of the current-mode low pass filter from increasing above a target frequency.

The low pass filter 16 may be coupled to the TIA 12 and the variable load circuit 14 and may generate the output voltage V_OUT by filtering the voltage signal V_SIG. The low pass filter 16 may receive signal C_BW and may have a cutoff frequency that varies according to signal C_BW. For example, the low pass filter 16 may include an active-RC filter having a variable cutoff frequency and a variable gain. The low pass filter 16 may include variable resistors and variable capacitors that are controlled according to signal C_BW, and may further include at least one amplifier. The low pass filter 16 may have an input impedance $Z_{IN2}$ (which may be hereinafter referred to as a second input impedance or just "$Z_{IN2}$" for brevity) as illustrated in FIG. 1, where $Z_{IN2}$ may vary according to the cutoff frequency of the low pass filter 16. For example, $Z_{IN2}$ may increase as the low pass filter 16's cutoff frequency decreases. A change in $Z_{IN2}$ may cause a change of the load impedance of the TIA 12, and the variable load circuit 14 may at least partially compensate for such a change in $Z_{IN2}$. An example of the low pass filter 16 is described below with reference to FIG. 6.

Figure 2:
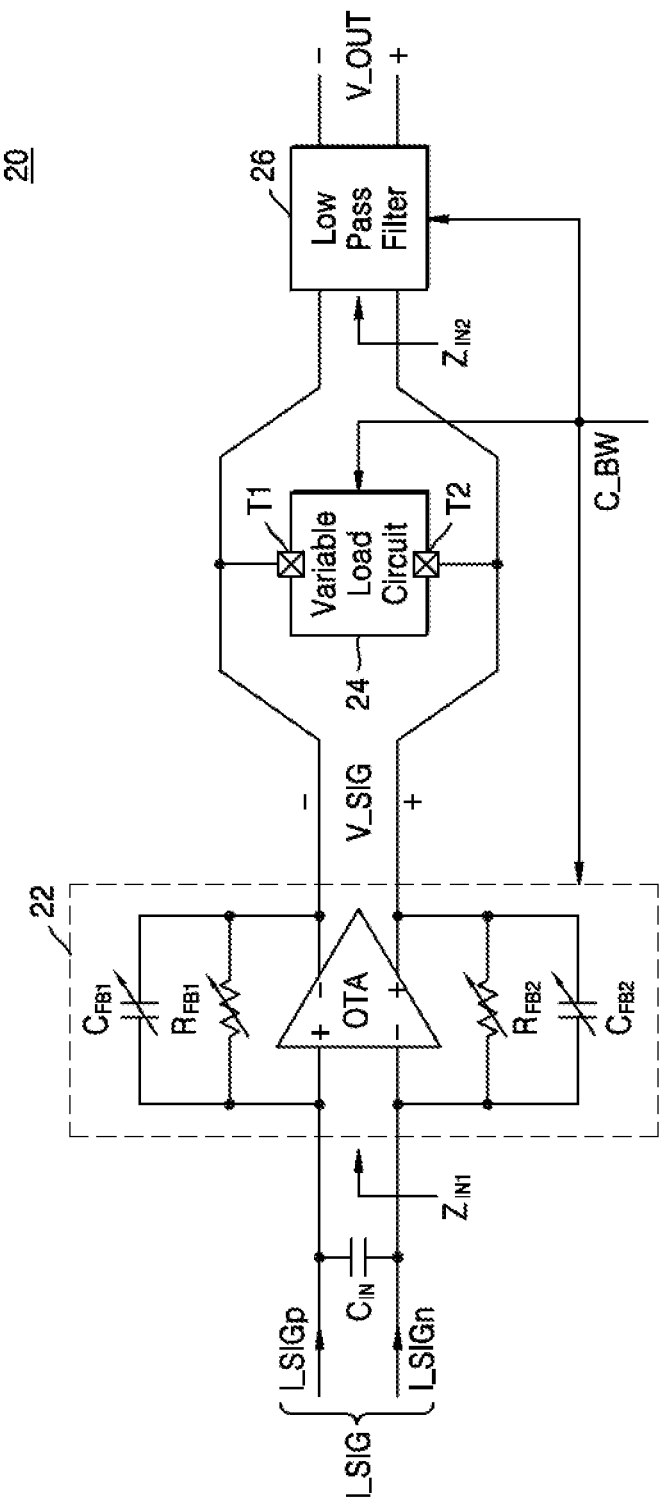
FIG. 2 is a circuit diagram of an example of a reconfigurable analog filter according to an example embodiment of the inventive concept.

FIG. 2 is a circuit diagram of a reconfigurable analog filter according to an example embodiment of the inventive concept. In detail, the circuit diagram of FIG. 2 illustrates a reconfigurable analog filter 20 (hereafter, "filter 20") configured to filter a differential signal, as an example of the reconfigurable analog filter 10 of FIG. 1. Similar to the reconfigurable analog filter 10 of FIG. 1, the filter 20 may include the input capacitor $C_{IN}$, a TIA 22, a variable load circuit 24, and a low pass filter 26. Hereinafter, aspects of FIG. 2, which are the same as the aspects described in FIG. 1, are omitted.

The filter 20 may filter a current signal I_SIG as a differential signal including complementary current signals I_SIGp and I_SIGn and may output an output voltage V_OUT as a differential signal. As illustrated in FIG. 2, the input capacitor $C_{IN}$ may have both ends respectively coupled to nodes, to which the complementary current signals I_SIGp and I_SIGn are applied, and the input capacitor $C_{IN}$ and $Z_{IN1}$ may form a current-mode low pass filter.

The TIA 22 may include an operational transconductance amplifier (OTA), feedback resistors $R_{FB1}$ and $R_{FB2}$, and feedback capacitors $C_{FB1}$ and $C_{FB2}$. The OTA may have any suitable structure to generate an output current from a differential input voltage. As illustrated in FIG. 2, the feedback resistors $R_{FB1}$ and $R_{FB2}$ may include variable resistors having resistances that are adjusted according to signal C_BW, and the feedback capacitors $C_{FB1}$ and $C_{FB2}$ may include variable capacitors having capacitances that are adjusted according to signal C_BW. In an alternative embodiment, the feedback resistors $R_{FB1}$ and $R_{FB2}$ may have fixed resistances independent of signal C_BW, and/or the feedback capacitors $C_{FB1}$ and $C_{FB2}$ may have fixed capacitances independent of signal C_BW.

For a wide passband, that is, a wide bandwidth of the reconfigurable analog filter 20 in a wideband mode, the OTA may be designed to have a high GBW. For example, when the reconfigurable analog filter 20 is used as a transceiver for a 5th generation (5G) new radio (NR), the OTA may be designed to have a GBW for a bandwidth equal to or higher than 100 MHz. An increase in the GBW of the OTA may cause a decrease in $Z_{IN1}$, and the decrease in $Z_{IN1}$ may cause an increase in a cutoff frequency of a current-mode low pass filter formed by the input capacitor $C_{IN}$ and $Z_{IN1}$. Thus, due to the increase in the cutoff frequency of the current-mode low pass filter, if no compensation mechanism is implemented, signal rejection characteristics of the reconfigurable analog filter 20 in a narrowband mode may deteriorate.

For a narrow passband, that is, a narrow bandwidth of the reconfigurable analog filter 20 in the narrowband mode, bandwidths of the TIA 22 and the low pass filter 26 may be decreased according to signal C_BW. For example, for an increase of an RC time constant, resistances of the feedback resistors $R_{FB1}$ and $R_{FB2}$ and/or capacitances of the feedback capacitors $C_{FB1}$ and $C_{FB2}$ of the TIA 22 may be increased and resistances of variable resistors and/or capacitances of variable capacitors of the low pass filter 26 may be increased. To prevent an increase of an area for an increase of a capacitance and satisfy slew rate requirements, resistances may be increased in a relatively higher manner than capacitances. Accordingly, an input impedance of the low pass filter 26, that is, $Z_{IN2}$, may be increased in the narrowband mode, and the increase of $Z_{IN2}$ may cause an increase of a load impedance of the OTA.

Unlike the configuration of FIG. 2, if the variable load circuit 24 were to be omitted, the increase of the load impedance of the OTA in the narrowband mode may cause an increase of an open-loop gain of the OTA, which may cause reduction of the input impedance of the TIA 22, that is, $Z_{IN1}$. Thus, the cutoff frequency of the current-mode low pass filter may be increased. Compared with a wideband RAT system, a narrowband RAT system may define more stringent signal rejection requirements. However, it may be difficult to satisfy these rejection requirements, due to the increase of the cutoff frequency of the current-mode low pass filter. On the other hand, as described below, the variable load circuit 24 may adjust a load impedance of the TIA 22 according to signal C_BW and optimize $Z_{IN1}$ according to a required bandwidth, and thus, it may be easy to satisfy the rejection requirements of the narrowband RAT system.

As illustrated in FIG. 2, the variable load circuit 24 may include a first terminal T1 and a second terminal T2, to which complementary signals of the voltage signal V_SIG, which is a differential signal, are respectively applied, and may adjust an impedance between the first terminal T1 and the second terminal T2 according to signal C_BW. The variable load circuit 24 may reduce a resistance between the first terminal T1 and the second terminal T2 and/or increase a capacitance between the first terminal T1 and the second terminal T2, in the narrowband mode, to decrease an open-loop gain of the OTA and increase $Z_{IN1}$. Accordingly, the variable load circuit 24 may compensate for the increase of $Z_{IN2}$ in the narrowband mode.

Figure 3:
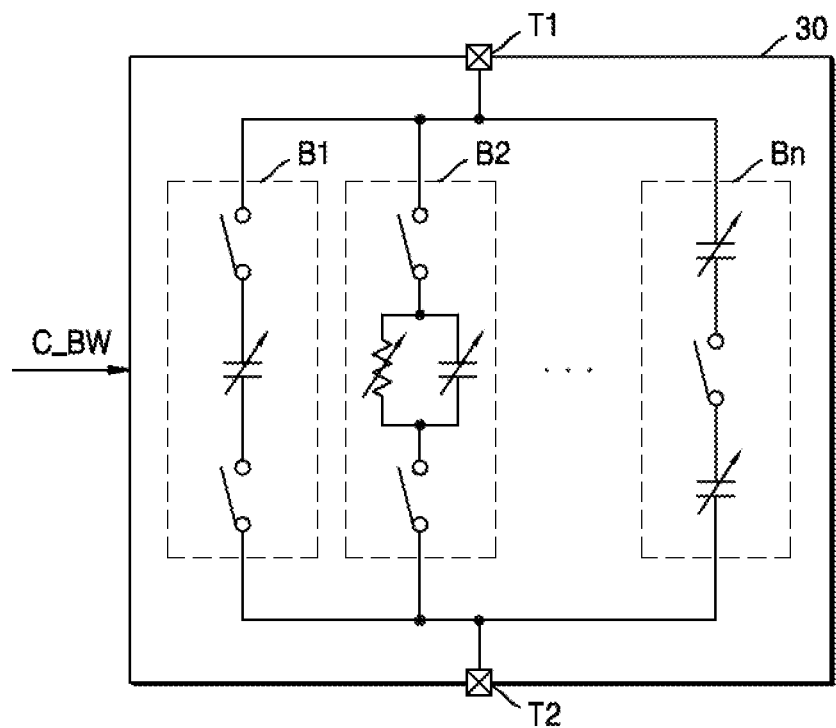
FIG. 3 is a block diagram of an example of a variable load circuit according to an example embodiment of the inventive concept.

FIG. 3 is a block diagram of a variable load circuit 30 according to an example embodiment of the inventive concept, which is an example of the variable load circuit 24. As described above with reference to FIG. 2, the variable load circuit 30 may adjust an impedance between a first terminal T1 and a second terminal T2 thereof according to signal C_BW, to adjust a load impedance of the TIA 22. Hereinafter, FIG. 3 is described with reference to FIG. 2.

The variable load circuit 30 may include a plurality of branches B1, B2, . . . , Bn (n is an integer greater than 2) connected to one another in parallel between the first terminal T1 and the second terminal T2. (In an alternative embodiment, only two branches are included.) As illustrated in FIG. 3, each of the branches B1-Bn may include at least one passive device, which is at least one resistor and/or a capacitor. Also, each of the branches B1-Bn may include at least one switch connected to the at least one passive device in series and turned-on or turned-off according to signal C_BW. For example, when the two switches included in a first branch B1 are both turned-on, the capacitor included in the first branch B1 may contribute to the load impedance of the TIA 22. On the other hand, when the switches included in the first branch B1 are turned-off, the capacitor included in the first branch B1 may not contribute to the load impedance of the TIA 22.

Herein, "on" or "turn-on" of a switch may refer to a state in which both ends of the switch are electrically connected, and "off" or "turn-off" of a switch may refer to a state in which both ends of the switch are electrically disconnected. Also, two or more components electrically connected through an on-state switch (directly or through wiring) may be referred to as being simply connected, and two or more components constantly electrically connected through another electrical component may be referred to as being coupled. Herein, a switch may have any suitable structure to achieve its intended function. For example, the switch may include at least one of an n-channel field effect transistor (NFET) and a p-channel field effect transistor (PFET), the NFET and the PFET having gates to which a control signal is applied.

In the variable load circuit 30, a path from the first terminal T1 to the second terminal T2 through the branches B1-Bn may have the same structure as a path from the second terminal T2 to the first terminal T1 through the branches B1-Bn. For example, the variable load circuit 30 may include branches each having a symmetric structure between the first terminal T1 and the second terminal T2, such as the first branch B1, the second branch B2, and the third branch B3. Alternatively or additionally, as described below with reference to FIG. 4, a variable load circuit 40 may include branches each having an asymmetric structure between the first terminal T1 and the second terminal T2 and coupled to the first terminal T1 and the second terminal T2 in opposite ways to one another.

Figure 4:
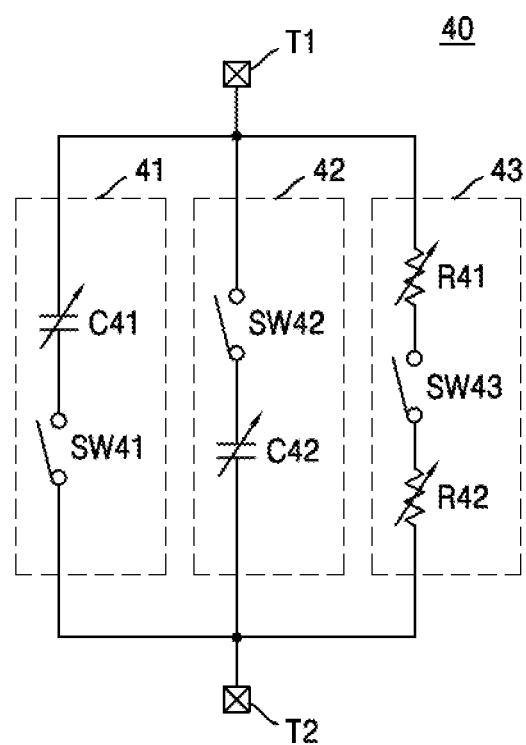
FIG. 4 is a circuit diagram of an example of a variable load circuit according to an example embodiment of the inventive concept.

FIG. 4 is a block diagram of a variable load circuit according to an example embodiment of the inventive concept. In detail, the block diagram of FIG. 4 illustrates the variable load circuit 40 including three branches, for example, first, second, and third branches 41, 42, and 43, as an example of the variable load circuit 24 of FIG. 2. Similarly as FIG. 2, the variable load circuit 40 may include the first terminal T1 and the second terminal T2, and may include the first branch 41, the second branch 42, and the third branch 43 connected to one another in parallel between the first terminal T1 and the second terminal T2. Although not illustrated in FIG. 4, each of the first to third branches 41-43 may receive a bandwidth control signal C_BW.

The variable load circuit 40 may include the plurality of branches such that a path from the first terminal T1 to the second terminal T2 has the same structure as a path from the second terminal T2 to the first terminal T1. For example, as illustrated in FIG. 4, the first branch 41 may include a first capacitor C41 and a first switch SW41 sequentially connected in series between the first terminal T1 and the second terminal T2, while the second branch 42 may include a second capacitor C42 and a second switch SW42 sequentially connected in series between the second terminal T2 and the first terminal T1. The first capacitor C41 and the second capacitor C42 may have the same structure, and the first switch SW41 and the second switch SW42 may have the same structure. Accordingly, the second branch 42 has the same structure as the first branch 41. However, the second branch 42 may be coupled to the first terminal T1 and the second terminal T2 in an opposite way to the first branch 41. As a result, in the variable load circuit 40, a path from the first terminal T1 to the second terminal T2 through the first branch 41 and the second branch 42 and a path from the second terminal T2 to the first terminal T1 through the first branch 41 and the second branch 42 may have the same structure.

The variable load circuit 40 may include a branch having a symmetric structure between the first terminal T1 and the second terminal T2. For example, as illustrated in FIG. 4, the third branch 43 may include a first resistor R41, a third switch SW43, and a second resistor R42 sequentially connected in series between the first terminal T1 and the second terminal T2, wherein the first resistor R41 and the second resistor R42 may have the same structure as each other. Accordingly, in the third branch 43, a path from the first terminal T1 to the second terminal T2 through the third branch 43 and a path from the second terminal T2 to the first terminal T1 through the third branch 43 may have the same structure as each other.

A passive device included in a branch may have a variable value according to signal C_BW. For example, the first capacitor C41 and the second capacitor C42 may be variable capacitors controlled according to signal C_BW, and the first resistor R41 and the second resistor R42 may be variable resistors controlled according to signal C_BW. In an alternative embodiment, the first capacitor C41 and the second capacitor C42 may have fixed capacitances independent of signal C_BW, and/or the first resistor R41 and the second resistor R42 may have fixed resistances independent of the signal C_BW. The variable resistor may include a plurality of resistor devices and a plurality of switches, and each of the plurality of switches may short-circuit both ends of the resistor device or open an end of the resistor device to selectively disable the resistor device. Thus, a resistance of the variable resistor may vary. Also, the variable capacitor may include a plurality of capacitor devices and a plurality of switches, and each of the plurality of switches may short-circuit both ends of the capacitor device or open an end of the capacitor device to selectively disable the capacitor device. In this manner, a capacitance of the variable capacitance may vary.

Figure 5:
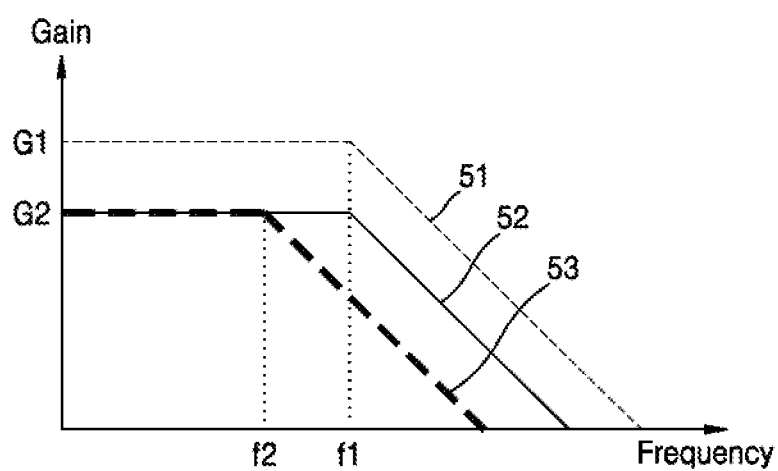
FIG. 5 is a graph of an example of a change of characteristics of a transimpedance amplifier according to an impedance of a variable load circuit, according to an example embodiment of the inventive concept.

FIG. 5 is a graph of an example of a change of gain vs. frequency characteristics of a transimpedance amplifier according to an impedance of a variable load circuit, according to an example embodiment of the inventive concept. In detail, the graph of FIG. 5 is a bode magnitude plot schematically illustrating frequency response characteristics of the TIA 22 according to an impedance between the first terminal T1 and the second terminal T2 of the variable load circuit 24, when the variable load circuit 24 of FIG. 2 has the structure of the variable load circuit 40 of FIG. 4. Hereinafter, FIG. 5 is described with reference to FIGS. 2 and 4, and it is assumed that the variable load circuit 24 of FIG. 2 includes the first branch 41, the second branch 42, or the third branch 43 of FIG. 4.

When the first switch SW41, the second switch SW42, and the third switch SW43 of FIG. 4 are turned-off, the TIA 22 may have a load impedance of a state in which the variable load circuit 24 is removed and the TIA 22 may have frequency response characteristics corresponding to a first curve 51 of FIG. 5. Thus, the TIA 22 may provide a first cutoff frequency f1 and a first gain G1, which are relatively high.

When the first switch SW41 and the second switch SW42 of FIG. 4 are turned-off and only the third switch SW43 is turned-on, the variable load circuit 24 may provide a resistance between the first terminal T1 and the second terminal T2 and the TIA 22 may have frequency response characteristics corresponding to a second curve 52 of FIG. 5. Accordingly, while the first cutoff frequency f1 may be maintained, the gain may be reduced to a second gain G2. Next, when all of the first switch SW41, the second switch SW42, and the third switch SW43 of FIG. 4 are turned-on, the variable load circuit 24 may provide not only a resistance, but also a capacitance between the first terminal T1 and the second terminal T2 and the TIA 22 may have frequency response characteristics corresponding to a third curve 53 of FIG. 5. Accordingly, while the second gain G2 may be maintained, the cutoff frequency may be reduced to a second cutoff frequency f2.

Figure 6:
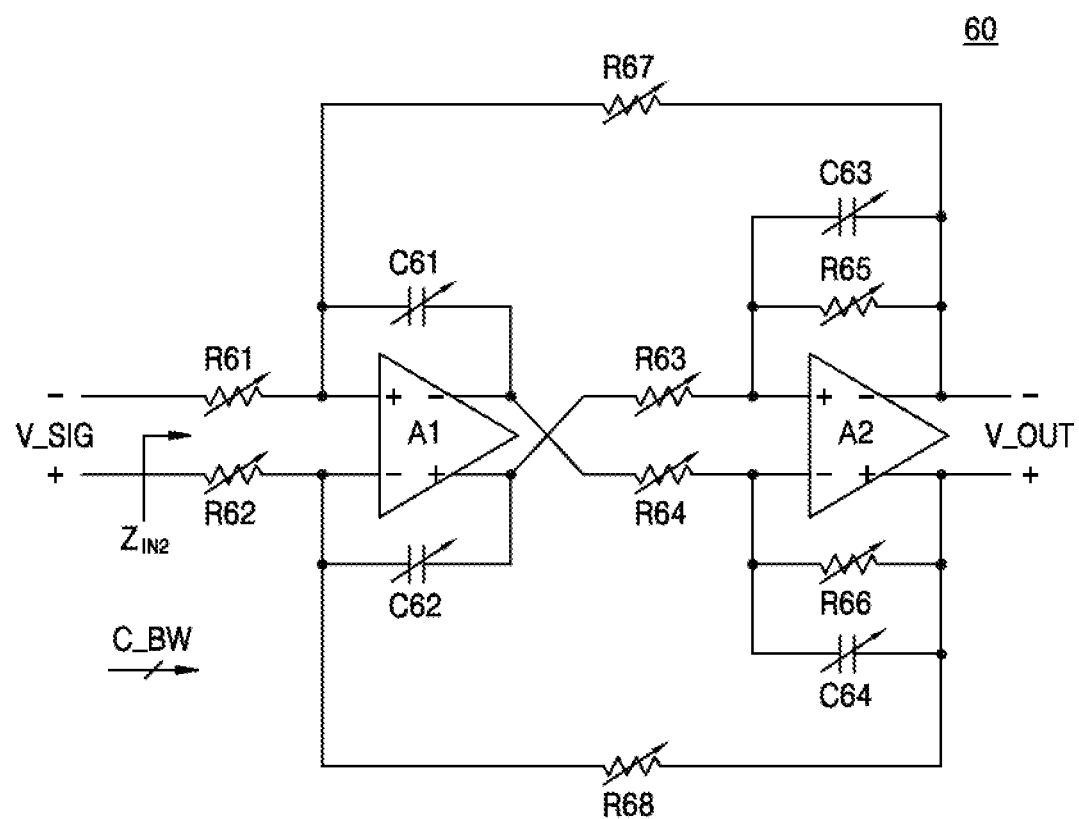
FIG. 6 is a circuit diagram of an example of a low pass filter according to an example embodiment of the inventive concept.

FIG. 6 is a circuit diagram of a low pass filter according to an example embodiment of the inventive concept. In detail, the circuit diagram of FIG. 6 illustrates an example of the low pass filter 26 of FIG. 2. As described above with reference to FIG. 2, a low pass filter 60 of FIG. 6 may generate an output voltage V_OUT, which is a differential signal, by filtering a voltage signal V_SIG as a differential signal. The low pass filter 60 may include a plurality of resistors R61 through R66, a plurality of capacitors C61 through C64, and first and second amplifiers A1 and A2.

The first resistor R61 and the second resistor R62 may receive the voltage signal V_SIG and may be coupled to the first amplifier A1. The first capacitor C61 and the second capacitor C62 may function as feedback capacitors of the first amplifier A1. The third resistor R3 and the fourth resistor R64 may receive an output signal of the first amplifier A1 and may be coupled to the second amplifier A2. The fifth resistor R65 and the sixth resistor R66 may function as feedback resistors of the second amplifier A2, and the third capacitor C63 and the fourth capacitor C64 may function as feedback capacitors of the second amplifier A2. The seventh resistor R67 and the eighth resistor R68 may be coupled to an output of the second amplifier A2 and an input of the first amplifier A1. The low pass filter 60 may be referred to as an active-RC filter and may also be referred to as a biquad filter.

The low pass filter 60 may receive signal C_BW and may have a variable bandwidth and a variable gain according to signal C_BW. In some embodiments, at least one of the plurality of resistors R61 through R68 may have a variable resistance according to signal C_BW, and at least one of the plurality of capacitors C61 through C64 may have a variable capacitance according to signal C_BW. For example, the first resistor R61 and the second resistor R62 may have relatively high resistances in a narrowband mode, and thus, an input impedance of the low pass filter 60, that is, $Z_{IN2}$ may be increased. As described above with reference to FIG.

2, etc., the increase of $Z_{IN2}$ in the narrowband mode may be compensated for by the variable load circuit 24.

Figure 7:
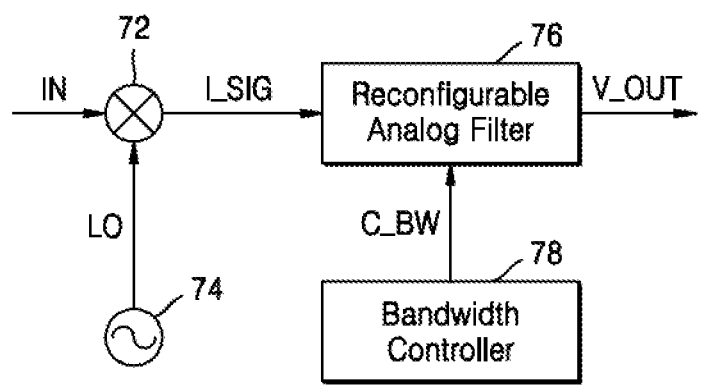
FIG. 7 is a block diagram of an example of an integrated circuit including a reconfigurable analog filter, according to an example embodiment of the inventive concept.

FIG. 7 is a block diagram of an example of an integrated circuit including a reconfigurable analog filter, according to an example embodiment of the inventive concept. In detail, the block diagram of FIG. 7 illustrates components of a receiver 70 including a reconfigurable analog filter 76 ("filter 76"). The receiver 70 may perform down-conversion on an input signal IN generated from a radio frequency (RF) signal received through an antenna or an intermediate frequency (IF) signal generated by performing down-conversion on the received RF signal. For example, the input signal IN may be generated from the RF signal by a low-noise amplifier included in the receiver 70.

The receiver 70 may include a mixer 72, a local oscillator (LO) generator 74, the 76, and a bandwidth controller 78. In some embodiments, the bandwidth controller 78 may be arranged outside the receiver 70. The receiver 70 may further include other components in addition to the components illustrated in FIG. 7. For example, the receiver 70 may further include a low-noise amplifier, etc. The receiver 70 may be part of a transceiver that includes components for transmission, for example, a power amplifier, a mixer, an analog filter, etc. The receiver 70 may be manufactured by using a semiconductor process and may be realized as a single die, a single semiconductor package including two or more dies, or two or more semiconductor packages. Hereinafter, it is assumed that the filter 76 includes the components of the filter 20 of FIG. 2.

The mixer 72 may generate a current signal I_SIG by performing down-conversion on the input signal IN according to a local oscillator signal LO. In some embodiments, the mixer 72 may include a passive mixer and an example of the mixer 72 is described below with reference to FIG. 8. The LO generator 74 may generate the local oscillator signal LO and adjust a frequency of the local oscillator signal LO. For example, the local oscillator signal LO may have a frequency corresponding to a carrier frequency. In some embodiments, the LO generator 74 may include an oscillator, a phased locked loop (PLL), etc.

A signal rejection function of the receiver 70 may be dependent upon removal of an interfering signal included in the current signal I_SIG between the mixer 72 and the TIA 22 included in the filter 76, (for example, the removal using a current-mode low pass filter). For example, the receiver 70 may support connection with respect to not only a narrowband RAT system (for example, 2G) defining a relatively low frequency channels with a narrow bandwidth (e.g., 200 kHz channels at frequencies up to 1.9 GHz), but also a wideband RAT system (for example, 5G NR) defining relatively high frequency operations at a wide bandwidth (for example, equal to or greater than 100 MHz at mm wave frequencies), and the receiver 70 may be required to provide good rejection performance in each of the different bandwidths. As described above with reference to the drawings, the filter 76 may effectively remove interference signals included in the current signal I_SIG also in the narrow bandwidth, by adjusting a load impedance of a TIA according to a cutoff frequency. Thus, not only the performance of the receiver 70, but also, the efficiency, for example, in terms of power consumption, area, etc., may be improved.

The bandwidth controller 78 may generate signal C_BW. For example, the bandwidth controller 78 may generate signal C_BW based on a channel bandwidth of a RAT system, to which the receiver 70 is connected. The bandwidth control signal C_BW may include a first control signal for controlling switches included in the variable load circuit 24, and a second control signal for controlling variable resistors and variable capacitors included in the TIA 22, the variable load circuit 24, and the low pass filter 26. In other examples, only a single control signal is provided. T Signal C_BW may be a multi-bit digital signal, and the first control signal may include a portion of multi-bits and the second control signal may include the other portion of the multi-bits. The second control signal may include an analog signal having a continuous level. The bandwidth controller 78 may include a state machine and may include a hardware module designed using logic synthesis. The bandwidth controller 78 may include a processor including at least one core and a processing unit including a memory storing a software module executed by the processor. An example operation of the bandwidth controller 78 is described below with reference to FIGS. 9 and 10.

Figure 8:
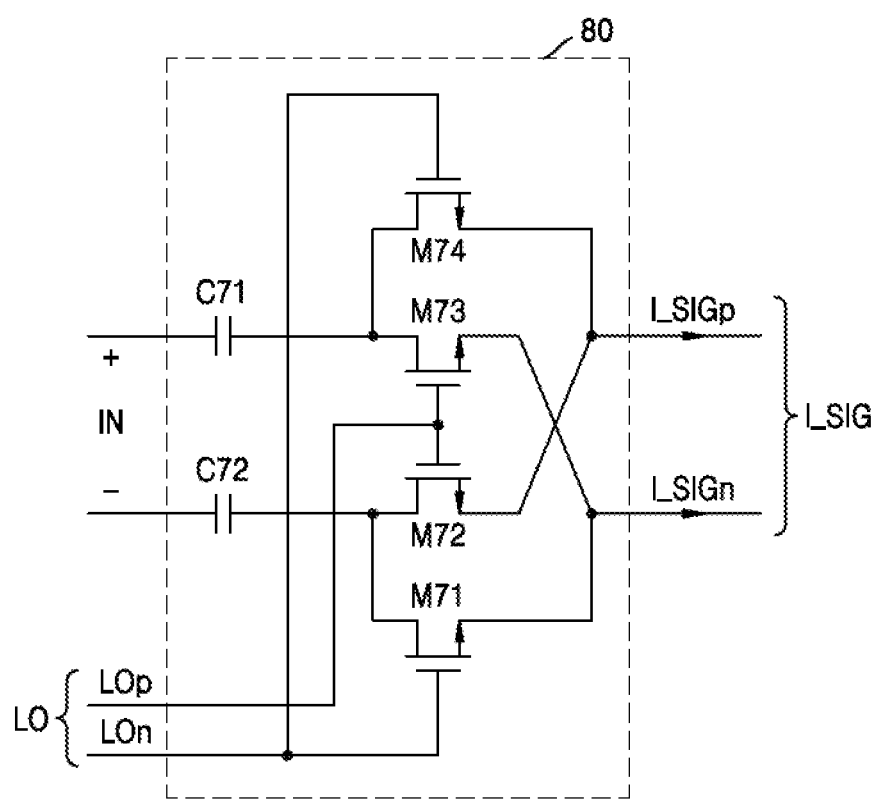
FIG. 8 is a circuit diagram of an example of a mixer according to an example embodiment of the inventive concept.

FIG. 8 is a circuit diagram of a mixer 80 according to an example embodiment of the inventive concept, which is an example of the mixer 72 of FIG. 7. The mixer 80 configured to process a differential signal. As described above with reference to FIG. 7, the mixer 80 may generate a current signal I_SIG by down-converting an input signal IN based on a local oscillator signal LO. It should be noted that other implementations for the mixer 72 of FIG. 7 are available, such as active mixer configurations.

The mixer 80 may include a first capacitor C71 and a second capacitor C72 for AC coupling of the input signal IN and may include a plurality of transistors M71 through M74. The configuration of mixer 80 illustrated in FIG. 8 is that of a passive mixer. In the mixer 80, the plurality of transistors M71 through M74 may be turned-on or turned-off according to the local oscillator signal LO. For example, the local oscillator signal LO may include complementary oscillator signals LOp and LOn as differential signals, and each of the plurality of transistors M71 through M74 may be turned-on or turned-off according to one of the complementary oscillator signals LOp and LOn. Thus, the mixer 80 may generate the current signal I_SIG as a differential signal including two complementary current signals I_SIGp and I_SIGn.

Figure 9:
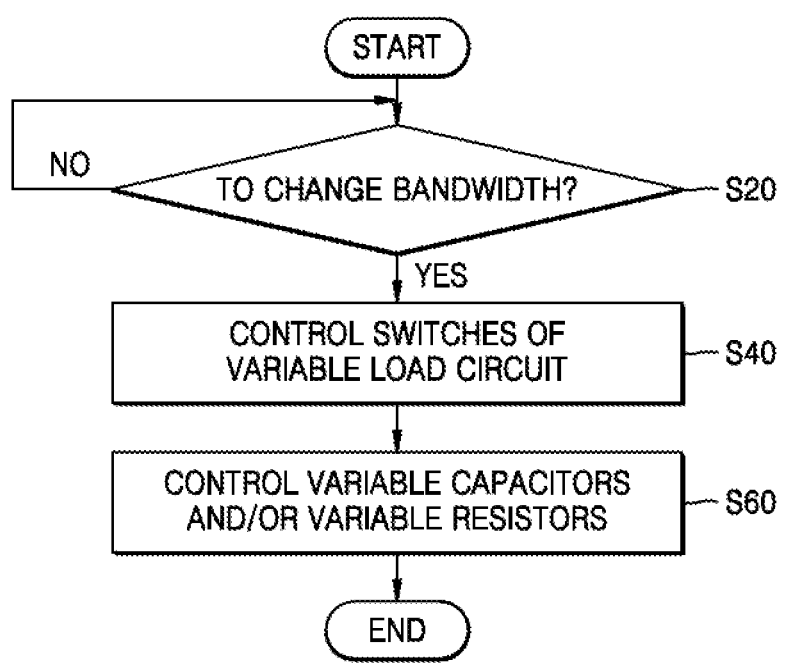
FIG. 9 is a flowchart of a method of controlling a reconfigurable analog filter, according to an example embodiment of the inventive concept.

FIG. 9 is a flowchart of a method of controlling a reconfigurable analog filter, according to an example embodiment of the inventive concept. As illustrated in FIG. 9, the method of controlling the reconfigurable analog filter may include a plurality of operations S20, S40, and S60. The method of FIG. 9 may be performed by the bandwidth controller 78 of FIG. 7. Hereinafter, FIG. 9 is described with reference to FIGS. 2 and 7, and it is assumed that the filter 76 of FIG. 7 includes the components of the filter 20 of FIG. 2.

Referring to FIG. 9, in operation S20, an operation of determining whether or not to change a bandwidth may be performed. For example, when the RAT system accessed by the receiver 70 of FIG. 7 is changed or a channel bandwidth in the RAT system is changed, the bandwidth controller 78 may determine to change a bandwidth, that is, a width of a passband of the filter 76. As illustrated in FIG. 9, when it is determined to change the bandwidth of the filter 76, operation S40 may be subsequently performed. Operation S60 may be performed after operation S20, and operations S40 and S80 may be performed in parallel after operation S20.

In operation S40, an operation of controlling switches of a variable load circuit may be performed. For example, the bandwidth controller 78 may generate a bandwidth control signal C_BW to turn-on or turn-off each of switches included in the variable load circuit 24 of the filter 76 based on the bandwidth changed in operation S20. For example, the bandwidth controller 78 may generate the signal C_BW to turn-off all of the switches included in the variable load circuit 24 in a wideband mode, while the bandwidth controller 78 may generate signal C_BW to turn-on at least one of the switches included in the variable load circuit 24 in a narrowband mode. Also, the bandwidth controller 78 may turn-off or turn-on each of the switches included in the variable load circuit 24 according to a bandwidth required in the narrowband mode. An example of operation S40 is described below with reference to FIG. 10.

In operation S60, an operation of controlling variable capacitors and/or variable resistors may be performed. As described above with reference to FIG. 2, the TIA 22, the variable load circuit 24, and the low pass filter 26 may include variable capacitors and/or variable resistors. The bandwidth controller 78 may adjust capacitances of the variable capacitors and/or resistances of the variable resistors based on the bandwidth changed in operation S20. Capacitances of the variable capacitors and/or resistances of the variable resistors corresponding to a bandwidth may be predetermined. For example, frequency response characteristics of the filter 76 may be tested in a manufacturing process of the receiver 70, and based on results of the test, the capacitances of the variable capacitors and/or the resistances of the variable resistors may be stored in a memory included in the bandwidth controller 78 or a memory accessible by the bandwidth controller 78. The bandwidth controller 78 may generate a bandwidth control signal C_BW to control the variable capacitors and/or the variable resistors based on the bandwidth changed in operation S20 and the data stored in the memory.

Figure 10:
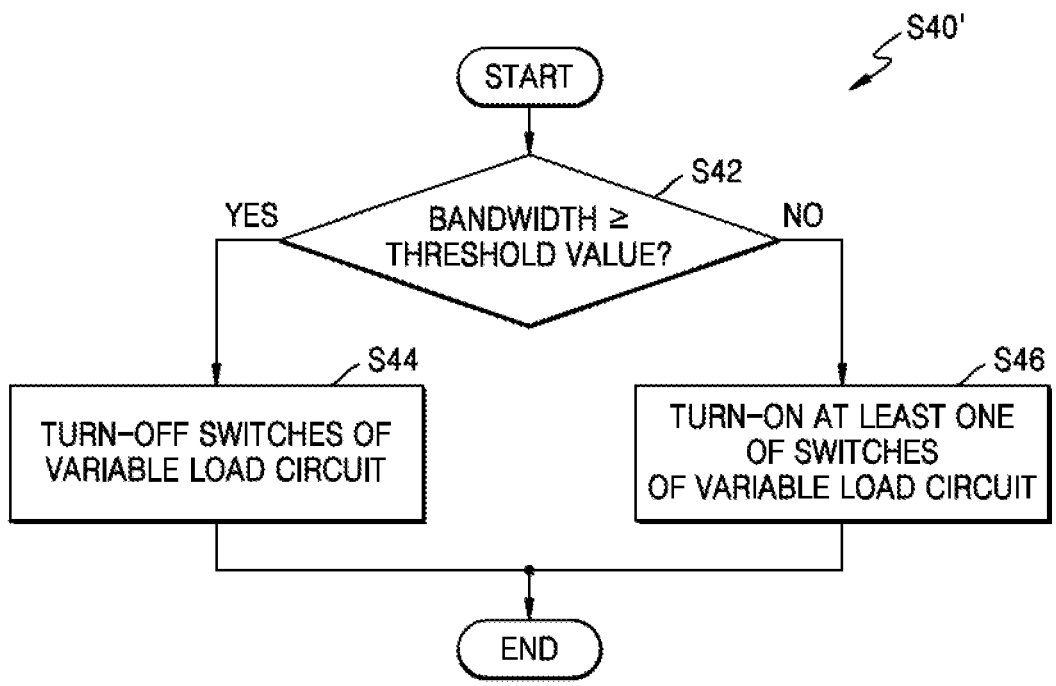
FIG. 10 is a flowchart of a method of controlling a reconfigurable analog filter, according to an example embodiment of the inventive concept.

FIG. 10 is a flowchart of a method of controlling a reconfigurable analog filter, according to an example embodiment of the inventive concept. In detail, the flowchart of FIG. 10 illustrates an example of operation S40 of FIG. 9. As described above with reference to FIG. 9, in operation S40' of FIG. 10, an operation of controlling switches of a variable load circuit may be performed. As illustrated in FIG. 10, operation S40' may include a plurality of operations S42, S44, and S46. Hereinafter, FIG. 10 is described with reference to FIGS. 2 and 9.

Referring to FIG. 10, in operation S42, an operation of comparing a bandwidth with a threshold value may be performed. As described above, the low pass filter 26 may have a low input impedance $Z_{IN2}$ in a wideband mode and may be required to minimize reduction of a load impedance of the TIA 22 due to the variable load circuit 24. On the other hand, the low pass filter 26 may have a high input impedance $Z_{IN2}$ in a narrowband mode and may be required to suppress an increase of the load impedance of the TIA 22. To this end, whether or not the bandwidth is equal to or greater than the threshold value (for example, 100 MHz) may be determined, and as illustrated in FIG. 10, when the bandwidth is equal to or greater than the threshold value, operation S44 may be subsequently performed, while, when the bandwidth is less than the threshold value, operation S46 may be subsequently performed.

In operation S44, an operation of turning-off the switches of the variable load circuit may be performed. As described above with reference to FIGS. 3 and 4, the variable load circuit 24 of FIG. 2 may include switches that, when turned-on, are configured to provide passive devices included in the variable load circuit 24 as a load of the TIA 22, and when turned-off, are configured to remove the passive devices from a load of the TIA 22. To minimize reduction of the load impedance of the TIA 22 due to the variable load circuit 24, a bandwidth control signal C_BW may be generated to turn-off the switches included in the variable load circuit 24.

In operation S46, an operation of turning-on at least one of the switches of the variable load circuit may be performed. As described above, it may be required to suppress an increase of the load impedance of the TIA 22 in the bandwidth less than the threshold value, and thus, the passive devices included in the variable load circuit 24, for example, at least one of the resistors and/or the capacitors, may contribute to the load impedance of the TIA 22. To this end, a bandwidth control signal C_BW may be generated to turn-on at least one of the switches included in the variable load circuit 24. As the bandwidth that is changed in operation S20 is decreased, the number of the switches that are turned-on in operation S46 may be increased.

Figure 11:
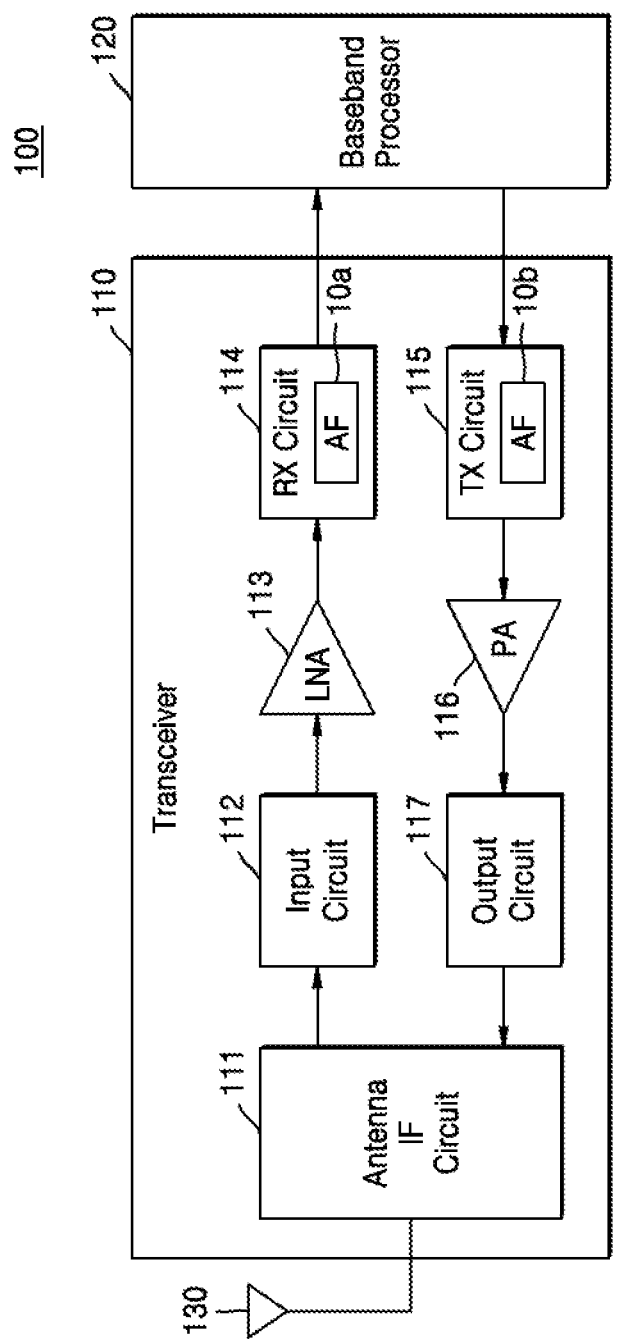
FIG. 11 is a block diagram of a radio access technology (RAT) device including a reconfigurable analog filter, according to an example embodiment of the inventive concept.

FIG. 11 is a block diagram of a wireless communication device 100 that includes reconfigurable analog filters according to an example embodiment of the inventive concept. In the wireless communication device 100, reconfigurable analog filters (AFs) 10a and 10b in both receive and transmit paths may be included in a transceiver 110. In other embodiments, only a single filter 10a or 10b is provided, for just the receive path or the transmit path. The filters 10a and 10b may each have a configuration as described above for filters 10 or 20.

The wireless communication device 100 may be included in a radio access technology (RAT) system using cellular networks, such as 5th generation (5G), long-term evolution (LTE), etc., and may be user equipment (UE) (or a "terminal") or a base station. Also, the wireless communication device 100 may be connected to, for example, a wireless personal area network (WPAN) system or a non-cellular-network type of RAT system. As illustrated in FIG. 11, the wireless communication device 100 may include the transceiver 110, a baseband processor 120, and an antenna 130.

The transceiver 110 may include an antenna interface circuit 111, a receiver including an input circuit 112, a low-noise amplifier 113, and a receiving circuit 114, and a transmitter including a transmitting circuit 115, a power amplifier 116, and an output circuit 117. The antenna interface circuit 111 may connect the transmitter or the receiver to the antenna 130 according to a transmission mode or a reception mode. The input circuit 112 may include a matching circuit or a filter, the low-noise amplifier 113 may amplify an output signal of the input circuit 112, and the receiving circuit 114 may include a mixer for down-conversion and may include the reconfigurable analog filter 10a. The transmitting circuit 115 may include a mixer for up conversion and may include the reconfigurable analog filter 10b. The power amplifier 116 may amplify an output signal of the transmitting circuit 115, and the output circuit 117 may include a matching circuit or a filter. The transceiver 110 may easily achieve a wide adjustable range of a channel bandwidth of radio communication, due to the reconfigurable analog filters. Thus, the wireless communication device 100 may provide not only improved radio communication quality, but also access to different RAT systems with reduced costs.

The baseband processor 120 may transceive baseband signals with the transceiver 110 and perform modulation/demodulation, encoding/decoding, channel estimation, etc., and may be referred to as a communication processor, a modem, etc. To adjust respective bandwidths of the reconfigurable analog filters 10a and 10b, the baseband processor 120 may provide a bandwidth control signal to the transceiver 110. In other embodiments, the transceiver 110 may include a bandwidth controller (not shown) configured to provide a bandwidth control signal to the reconfigurable analog filters 10a and 10b.

While the inventive concept has been particularly shown and described with reference to embodiments thereof, it will be understood that various changes in form and details may be made therein without departing from the spirit and scope of the following claims.

What is claimed is:

1. A reconfigurable analog filter comprising:
   a transimpedance amplifier configured to convert a current signal into a voltage signal;
   an input capacitor configured to form a current-mode low pass filter together with an input impedance of the transimpedance amplifier;
   a variable load circuit comprising at least one switch configured to selectively close a circuit path to provide a variable resistor as at least a portion of a load of the transimpedance amplifier according to a control signal; and
   a low pass filter configured to filter the voltage signal.

2. The reconfigurable analog filter of claim 1, wherein:
   the transimpedance amplifier is further configured to output the voltage signal as a differential signal comprising two complementary signals, and
   the variable load circuit comprises a first terminal and a second terminal configured to receive the two complementary signals, respectively.

3. The reconfigurable analog filter of claim 2, wherein:
   the variable load circuit comprises a plurality of branches connected to one another in parallel between the first terminal and the second terminal, and
   a path from the first terminal to the second terminal through the plurality of branches and a path from the second terminal to the first terminal through the plurality of branches have the same structure.

4. The reconfigurable analog filter of claim 2, wherein the variable load circuit further comprises a branch having a symmetric structure between the first terminal and the second terminal.

5. The reconfigurable analog filter of claim 2, wherein the variable load circuit further comprises:
   a first branch having an asymmetric structure between the first terminal and the second terminal; and
   a second branch having the same structure as the first branch and coupled to the first terminal and the second terminal in the opposite way to the first branch.

6. The reconfigurable analog filter of claim 2, wherein the variable:
   resistor is configured to selectively provide a resistance according to the control signal between the first terminal and the second terminal; and
   the reconfigurable analog filter further comprising at least one capacitor branch configured to selectively provide a capacitance according to the control signal between the first terminal and the second terminal.

7. The reconfigurable analog filter of claim 1, wherein the variable load circuit further comprises at least one variable capacitor, and the low pass filter comprises at least one variable resistor and at least one variable capacitor, and each of the variable capacitors and the variable resistors of the variable load circuit and the low pass filter are configured to be controlled according to the control signal.

8. A reconfigurable analog filter comprising:
   a transimpedance amplifier configured to convert a current signal into a voltage signal;
   an input capacitor configured to form a current-mode low pass filter together with an input impedance of the transimpedance amplifier;
   a variable load circuit configured to provide a first impedance as a load of the transimpedance amplifier in a wideband mode and provide a second impedance lower than the first impedance as the load of the transimpedance amplifier in a narrowband mode, according to a control signal; and
   a low pass filter configured to filter the voltage signal,
   wherein the wideband mode and the narrowband mode are modes in which the reconfigurable analog filter provides a low pass filter characteristic with a first cutoff frequency and a second cutoff frequency, respectively, the second cutoff frequency being lower than the first cutoff frequency.

9. The reconfigurable analog filter of claim 8, wherein the reconfigurable analog filter is configured to provide a low passband width equal to or higher than 100 MHz in the wideband mode and provide a low passband width equal to or lower than 200 kHz in the narrowband mode.

10. The reconfigurable analog filter of claim 8, wherein:
    the transimpedance amplifier comprises:
    an operational transconductance amplifier (OTA); and
    a feedback resistor and a feedback capacitor of the OTA, and
    the variable load circuit is further configured to increase an open-loop gain of the OTA in the wideband mode as compared to the narrowband mode.

11. The reconfigurable analog filter of claim 8, wherein the variable load circuit is further configured to decrease the input impedance in the wideband mode as compared to the narrowband mode.

12. The reconfigurable analog filter of claim 8, wherein the low pass filter is further configured to provide a variable bandwidth and a variable gain according to the control signal.

13. An integrated circuit comprising:
    a mixer configured to generate a current signal by performing down-conversion on an input signal according to a local oscillator signal; and
    a reconfigurable analog filter configured to provide a variable low pass filter cutoff frequency according to a control signal and filter the current signal, wherein
    the reconfigurable analog filter comprises:
    a transimpedance amplifier configured to convert the current signal into a voltage signal;
    an input capacitor configured to form a current-mode low pass filter together with an input impedance of the transimpedance amplifier;
    a variable load circuit configured to adjust a load impedance of the transimpedance amplifier according to the control signal and correspondingly vary the low pass filter cutoff frequency; and
    a low pass filter configured to filter the voltage signal.

14. The integrated circuit of claim 13, wherein the mixer comprises a passive mixer comprising transistors configured to be turned-on or turned-off according to the local oscillator signal.

15. The integrated circuit of claim 13, wherein:
    the mixer is further configured to generate the current signal as a differential signal, and
    the differential signal is applied to opposite ends of the input capacitor.

16. The integrated circuit of claim 13, wherein the transimpedance amplifier comprises:
- an operational transconductance amplifier (OTA); and
- a feedback resistor and a feedback capacitor of the OTA.

17. The integrated circuit of claim 13, wherein the variable load circuit comprises a plurality of branches each comprising at least one passive device comprising at least one of a resistor and a capacitor, and a switch connected to the at least one passive device in series, the plurality of branches being connected to one another in parallel between a first terminal and a second terminal.

18. The integrated circuit of claim 17, wherein the plurality of branches comprise branches comprising a first resistor, a switch, and a second resistor sequentially connected in series between the first terminal and the second terminal.

19. The integrated circuit of claim 17, wherein the plurality of branches comprise:
- a first branch comprising a first capacitor and a first switch sequentially connected in series between the first terminal and the second terminal; and
- a second branch comprising a second capacitor and a second switch sequentially connected in series between the second terminal and the first terminal.

20. The integrated circuit of claim 13, wherein the low pass filter comprises:
- at least one amplifier;
- at least one variable resistor configured to provide a variable resistance according to the bandwidth control signal; and
- at least one variable capacitor configured to provide a variable capacitance according to the control signal.

* * * * *